(12) United States Patent
Martin et al.

(10) Patent No.: US 7,676,211 B2
(45) Date of Patent: Mar. 9, 2010

(54) RECONFIGURABLE BASEBAND FILTER

(75) Inventors: Brian C. Martin, Carlsbad, CA (US); Lawrence J. Malone, Carlsbad, CA (US)

(73) Assignee: Spreadtrum Communications Inc., George Town, Grand Cayman (KY)

( * ) Notice: Subject to any disclaimer, the term of this patent is extended or adjusted under 35 U.S.C. 154(b) by 1536 days.

(21) Appl. No.: 10/828,740

(22) Filed: Apr. 20, 2004

(65) Prior Publication Data

US 2004/0209591 A1    Oct. 21, 2004

Related U.S. Application Data (60) Provisional application No. 60/464,162, filed on Apr. 21, 2003.

(51) Int. Cl.
   *H04B 1/26* (2006.01)
(52) U.S. Cl. .................. 455/307; 455/334; 455/129
(58) Field of Classification Search .......... 455/307, 455/334, 333, 129, 296; 333/202, 205
   See application file for complete search history.

(56) References Cited

U.S. PATENT DOCUMENTS

| | | | |
|---|---|---|---|
| 4,300,435 A | | 11/1981 | Schmoll, III |
| 4,644,304 A | * | 2/1987 | Temes .......................... 333/173 |
| 5,181,033 A | * | 1/1993 | Yassa et al. .................. 333/173 |
| 5,403,262 A | * | 4/1995 | Gooch ........................ 455/307 |
| 5,563,573 A | | 10/1996 | Ng et al. |
| 6,329,939 B1 | * | 12/2001 | Swaminathan et al. ...... 333/173 |
| 6,351,229 B1 | * | 2/2002 | Wang ......................... 341/143 |
| 6,351,506 B1 | * | 2/2002 | Lewicki ...................... 375/350 |
| 6,748,025 B1 | * | 6/2004 | Hickling ..................... 455/296 |
| 6,970,120 B1 | * | 11/2005 | Bjornsen .................... 341/120 |
| 6,975,600 B1 | * | 12/2005 | Vaughan et al. ............. 370/321 |
| 6,975,846 B2 | * | 12/2005 | Chang et al. ................ 455/295 |
| 7,123,182 B1 | * | 10/2006 | Childs ......................... 342/14 |
| 2003/0207679 A1 | * | 11/2003 | Kaczynski et al. .......... 455/334 |
| 2003/0224752 A1 | * | 12/2003 | Rawlins et al. .............. 455/307 |
| 2004/0196934 A1 | * | 10/2004 | Petrov et al. ................ 375/350 |

FOREIGN PATENT DOCUMENTS

| | | |
|---|---|---|
| DE | 2731883 A1 | 2/1979 |
| EP | 1098449 A1 | 5/2001 |
| GB | 2081543 A | 2/1982 |
| JP | 2002-359543 | * 12/2002 |
| SU | 771891 B | * 10/1980 |

* cited by examiner

*Primary Examiner*—Lana N Le (57) ABSTRACT

A reconfigurable baseband filter for use in a multimode communication system is disclosed. One or more filter elements can each be configured as a plurality of sub-elements. The value of each of the filter elements can be varied by switching between at least two of the plurality of sub-elements. Switching noise within a desired passband can be reduced by switching at a rate that is greater than the desired passband. The switching noise in the passband can be further reduced by pseudo-randomly switching between the sub-elements. The filter can use a delta-sigma modulator to generate a pseudo-random switching signal.

1 Claim, 7 Drawing Sheets

RECONFIGURABLE BASEBAND FILTER

CROSS-REFERENCES TO RELATED APPLICATIONS

This application claims the benefit of U.S. Provisional Application No. 60/464,162, filed Apr. 21, 2003, entitled RECONFIGURABLE BASEBAND FILTER FOR MULTI-MODE COMMUNICATION SYSTEMS, hereby incorporated herein by reference in its entirety.

BACKGROUND OF THE DISCLOSURE

Filters are used in communications systems for many purposes. In radio receivers, an active filter can be used to amplify signals at certain frequencies and reject those at other frequencies as to segregate wanted information from unwanted. In other words, filters allow the radio receiver to provide the listener with substantially the desired signal and substantially reject all other signals. In radio transmitters, filters act to mitigate extraneous emissions out of the intended band. A filter may pass the signals in the intended band and attenuate those signals that lie outside of the intended band. The radio transmitter can generate the signals in the desired band and will not transmit other signals that might interfere with other spectrum users.

Analog filters used in the baseband section of RF receivers typically satisfy stringent noise, linearity, power dissipation, and selectivity requirements. The existence of large interferers near the desired signal frequency demands a high linearity and/or low noise in the filters, impacting the distribution of gain and noise through the receiver chain.

For these reasons, on-chip filters typically use a lot of die area. A multi standard radio may support several standards, each with different bandwidth requirements. Due to differing requirements for each standard, different filters are typically used. Multiple filters further aggravate the amount of die area used to implement filters. Multi standard radios that implement one filter for each standard add the cost of having the multiple filters to the cost of the radio.

Wireless communication devices having the ability to operate under different communication standards are presently in demand. Consumers of the multi-mode devices want increased levels of performance, but also desire low cost and small physical size. It is desirable to improve the performance of a multi-mode device without increasing the cost of the device and without increasing the size of the device.

BRIEF SUMMARY OF THE DISCLOSURE

A reconfigurable baseband filter for use in a multimode communication system is disclosed. One or more filter elements can each be configured as a plurality of sub-elements. The value of each of the filter elements can be varied by switching between at least two of the plurality of sub-elements. Switching noise within a desired passband can be reduced by switching at a rate that is greater than the desired passband. The switching noise in the passband can be further reduced by pseudo-randomly switching between the sub-elements. The filter can use a delta-sigma modulator to generate a pseudo-random switching signal.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF THE DISCLOSURE

A reconfigurable baseband filter and systems implementing reconfigurable baseband filters are disclosed. A filter can include one or more elements configured to provide a filter response. Each of the elements can include a plurality of sub-elements. At least two of the plurality of sub-elements can be configured to be electrically in parallel. In one embodiment, an element includes two sub-elements switchably connected in parallel. In another embodiment, an element can include three or more sub-elements switchable connected in parallel. Increasing the number of sub-elements switchably connected in parallel may reduce a switching noise contribution. For example, selecting between three parallel sub-elements may generate less noise than switching between two sub-elements.

The filter can switch between, for example, two parallel sub-elements to selectively connect one of the sub-elements to the filter configuration. The filter selectively switches between parallel sub-elements to produce an element value that can be determined based in part on the duration that each sub-element is connected within the filter. The switches can be controlled using a pseudo random switching control signal to reduce switching noise contributions to the filter output.

Figure 1A:
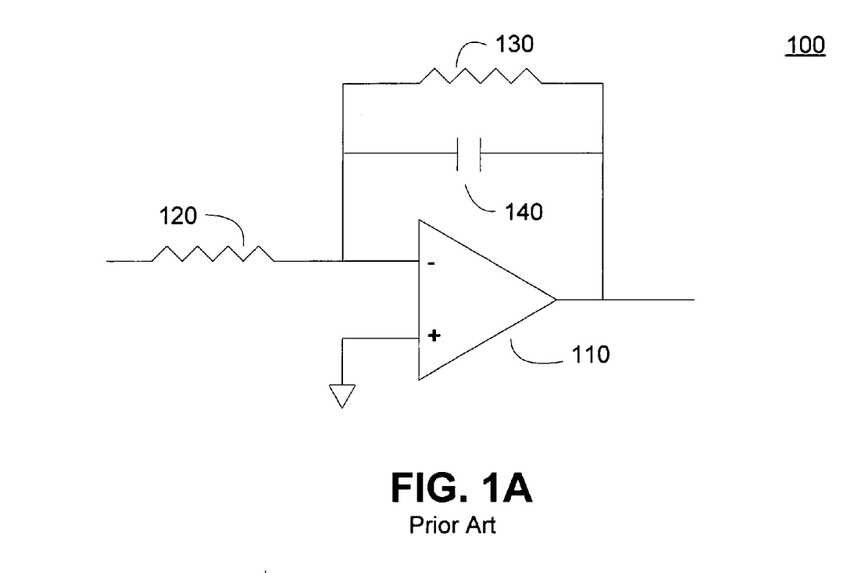
FIG. 1A is a functional block diagram of a prior art fixed bandwidth filter

FIG. 1A is a functional block diagram of a prior art single pole active lowpass filter 100. The filter 100 includes an amplifier 110, such as an operational amplifier having an inverting input, a non-inverting input, and an output. The filter 100 also includes a number of passive elements configured to provide a lowpass filter response.

A first resistor 120 couples a signal from a filter input to the inverting input of the amplifier 110. A second resistor 130 couples the output of the amplifier 110 to the inverting input. Similarly, a capacitor 140 connected in parallel to the second resistor 130 couples the output of the amplifier 110 to the inverting input. The non-inverting input of the amplifier 100 is coupled to a voltage common, which may be referred to as a return or ground.

Figure 1B:
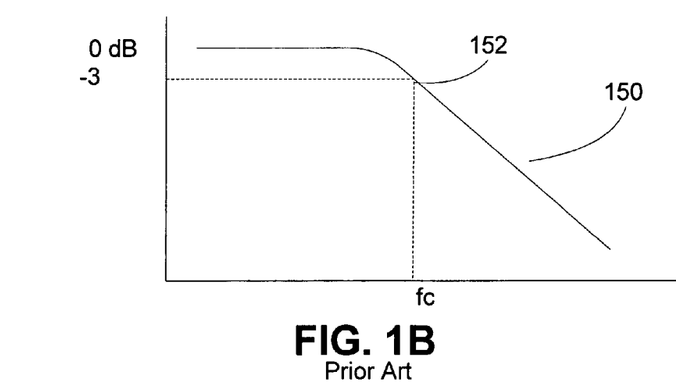
FIG. 1B is a plot of an embodiment of the fixed bandwidth filter of FIG. 1A.

The values of the first resistor 120, second resistor 130, and capacitor 130 can be fixed to provide a lowpass filter response 150 as shown in FIG. 1B. The lowpass filter response 150 of FIG. 1B includes a passband and a stop band. The passband of the filter response 150 is typically characterized using the frequency at which the amplitude response falls below a predetermined value. Typical amplitude values used to characterize a filter response include −1 dB and −3 dB, although any predetermined value can be used to characterize a filter response. In the filter response 150 of FIG. 1B, the passband response is characterized by the −3 dB response point 152 that occurs at a frequency of $f_{3dB}$.

A particular filter 100 configuration can provide a single predetermined frequency response. Multi-mode communication devices typically support a plurality of communication standards. The plurality of communication standards can each have different signal bandwidths, signaling rates, or data rates. A filter having a frequency response optimized for a particular communication standard will likely not be optimized for a different frequency standard.

For example, in a receiver configuration, the frequency response of a baseband filter may substantially define a noise bandwidth of the receiver. An excess noise bandwidth typically degrades the received signal quality and may prevent distinguishing of signals that are near a theoretical sensitivity limit, regardless of the quality of the devices used in the receiver design. Thus, a baseband filter in a receiver configuration can have a frequency response that is configured to pass substantially the entire desired signal spectrum while rejecting substantially signals outside the desired signal spectrum.

A multi-mode receiver may, for example, be configured as a multiple mode wireless communication device. Several wireless communication standards exist and each of the wireless standards may utilize a different signal bandwidth or signaling rate.

For example, the signal bandwidth in a communication device operating in accordance with the Advanced Mobile Phone System (AMPS) standard may use a baseband signal bandwidth of 30 kHz. A communication device operating in accordance with a Code Division Multiple Access (CDMA) communication standard, such as Telecommunications Industry Association/Electronics Industries Alliance (TLA/EIA) IS-95 may utilize a baseband signal bandwidth of 600 kHz or greater. Similarly, a communication device operating in accordance with GSM standards may operate with a baseband signal bandwidth of 150 kHz. Similarly, devices operating in accordance with the Bluetooth communication standard may operate with a baseband signal bandwidth of 300 kHz. Similarly, a device operating in accordance with Wideband CDMA (WCDMA) communication standard may operate with a baseband signal bandwidth of 3.8 MHz. In yet another communication standard, a device operating in accordance with a wireless Local Area Network (LAN) standard, such as the IEEE 802.11 standard may operate with a baseband signal bandwidth of 9 MHz. Still other communication standards may use other baseband signal bandwidths.

Thus, a multi-mode device operating in one or more of the above-mentioned standards typically cannot use the same baseband filter to provide the baseband frequency response for more than one communication standard. A fixed frequency response filter, for example the filter 100 of FIG. 1A, that is optimized for AMPS communication will not have sufficient bandwidth to support WCDMA. Similarly, a fixed frequency response filter that is optimized for an IEEE 802.11 standard may have a baseband bandwidth that is far greater than is required to support an AMPS communication mode. As mentioned above, such an excess bandwidth typically results in excess noise power and degradation of the receiver sensitivity.

A typical method for a receiver to implement an optimized baseband signal bandwidth for multiple communication standards is to use multiple different filters, with a filter for each desired frequency response. Simply, multiple filters can be connected in parallel and the filter having the desired frequency response is used while the others are turned off.

The drawbacks of this approach include increased area and cost needed to implement multiple filters. Another drawback is that component values, such as resistor and capacitor values, tend to vary from their nominal value especially when implemented in integrated circuits. To combat the problem of component value variations, a large string of resistors can be provided on-chip. A number of resistors in parallel with each resistor varying slightly from the nominal value can be provided on a chip to allow selection of a desired resistor value. An external system can be used to directly or indirectly measure the resistors and determine which most closely approximates the desired resistor value. However, the need for numerous components in parallel further aggravates the cost and area limitations.

Figure 2A:
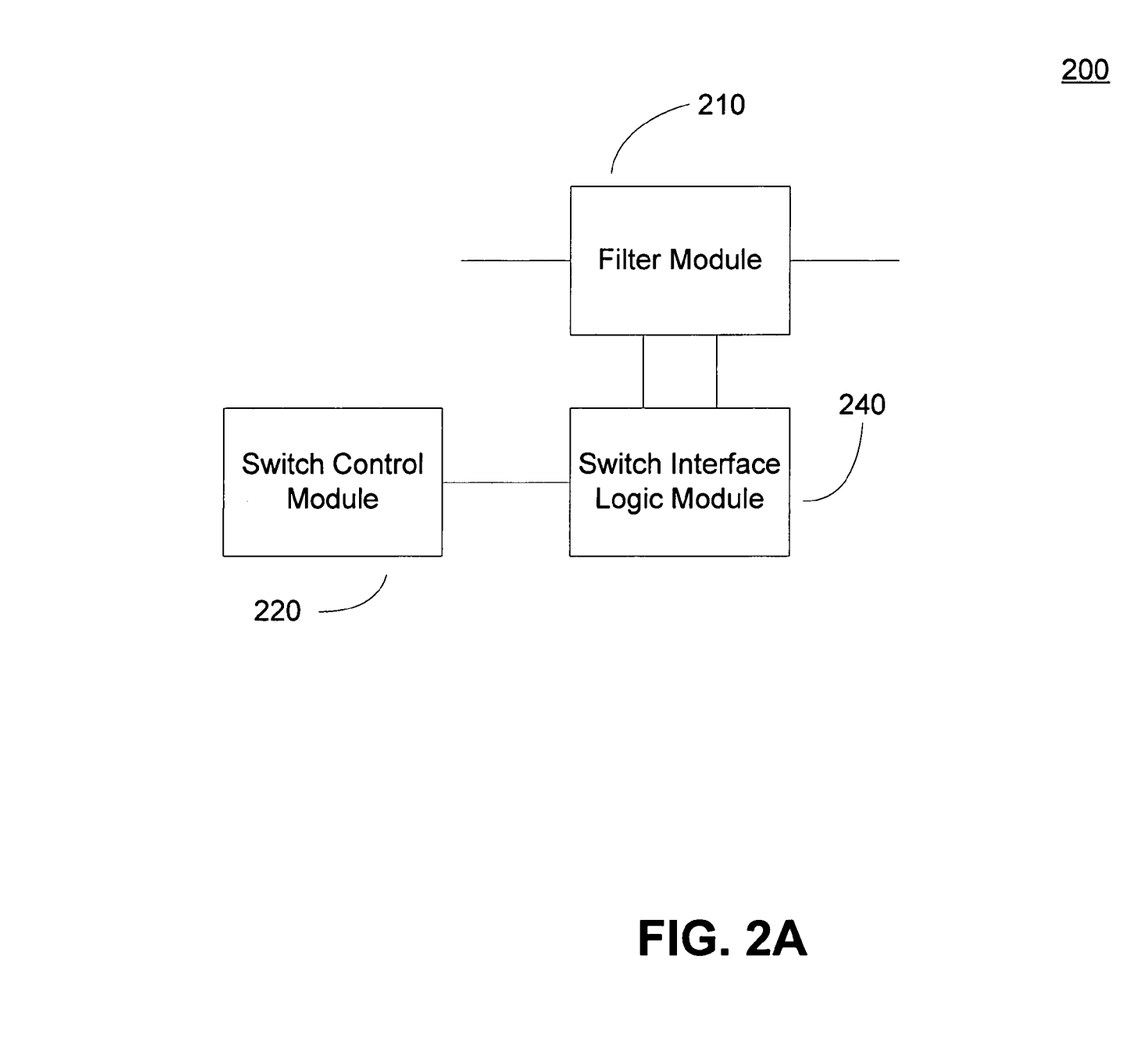
FIGS. 2A-2B are a functional block diagrams of an embodiments of a reconfigurable filter.

FIG. 2A is a functional block diagram of a reconfigurable filter 200. The reconfigurable filter 210 includes a filter module 210 having multiple filter elements configured to provide a desired filter response. The filter module 210 can also include one or more filter elements that are configurable based at least in part on a switch control signal. The switch control signal configures the one or more configurable elements, and the filter module 210 provides the filter response defined by the switch control signal.

In one embodiment, each configurable filter element includes a pair of like filter elements of different value arranged in parallel within a filter configuration. Each of the like filter elements is selectively coupled to the filter by a switch configuration controlled by the switch control signal. In one embodiment, the configurable filter element within a filter circuit can include two resistors arranged in parallel. Switches can be connected in series with the resistors to selectively connect a corresponding resistor to the filter circuit. The switch control signal can be used to selectively connect one or the other of the parallel resistors to the filter circuit. A filter element resistor value can be generated by varying a percentage of time that one or the other of the resistors is connected to the filter circuit.

The reconfigurable filter 200 also includes a switch control module 220 configured to generate one or more switch control signals that can be used to configure one or more elements of the filter module 210.

A switch interface logic module 240 can be used to couple the switch control signals generated in the switch control module 220 to the control inputs of the filter module 210. In some embodiments, the switch interface logic module 240 may be integrated within the switch control module 240 or the filter module 210.

The switch interface logic module 240 can be configured, for example, to transform the control signal output from an output format provided by the switch control module 220 to a format desired by the filter module 210. For example, the switch interface logic module 240 may be configured to generate a differential signal from a single ended signal. In another embodiment, the switch interface logic module 240 may be configured to transform the control signal from a first logic level to a second logic level. In still other embodiments, the switch interface logic module 240 may process the switch control signal in other ways.

The switch control module 220 can contribute, by controlling the switches in the filter module 210, switching noise contributed to the filter module 210. Thus, it may be desirable to reduce the switching noise contribution.

In one embodiment, the switch control module 220 can be configured to generate a periodic switch control signal and may vary the duty cycle of the switch control signal. The frequency of the periodic switch control signal can be configured to be outside a desired signal bandwidth in order to minimize switching noise contributions. For example, if the desired frequency response is a lowpass response having a passband of 500 kHz, the frequency of the switch control signal may be selected to be greater than 500 kHz. The actual frequency of the switch control signal may be selected based on a variety of factors, including, for example, a maximum operating speed of the switching circuits and an acceptable level of switching noise.

In another embodiment, the switch control module 220 can be configured to generate a pseudo random switch control signal. A pseudo random switch control signal may generate a broader spectrum of switching noise and thus, the switching noise at any particular frequency may be less than the peak switching noise generated by a periodic signal. The switch control module 220 may, for example, implement a linear feedback shift register (LFSR) such as a maximum length LFSR configured to provide a pseudo random output. The switch control module 220 may then control the duty cycle of the pseudo random output. The switch control module 220 may clock the pseudo random control signal at a rate that is outside the desired filter response to further minimize the switching noise contribution.

In other embodiments, the switch control module 220 can include a memory or register configured to store a pseudo random bit sequence. The switch control module 220 may then clock or shift the bits of the pseudo random bit sequence to generate the pseudo random control signal. The stored pseudo random bit sequence can have, for example, some known property. For example, the stored pseudo random bit sequence can be a Barker code or a Walsh code that may be configured to provide a minimal noise contribution to a desired signal.

In still another embodiment, the switch control module 220 can be configured to generate a pseudo random switch control signal, where the pseudo random output varies in order to achieve a desired filter element value. The switch control module 220 can implement, for example, a delta-sigma modulator to generate a pseudo random switch control signal. The distribution of high and low logic levels output from the delta-sigma modulator can be used to control the filter element value.

Figure 2B:
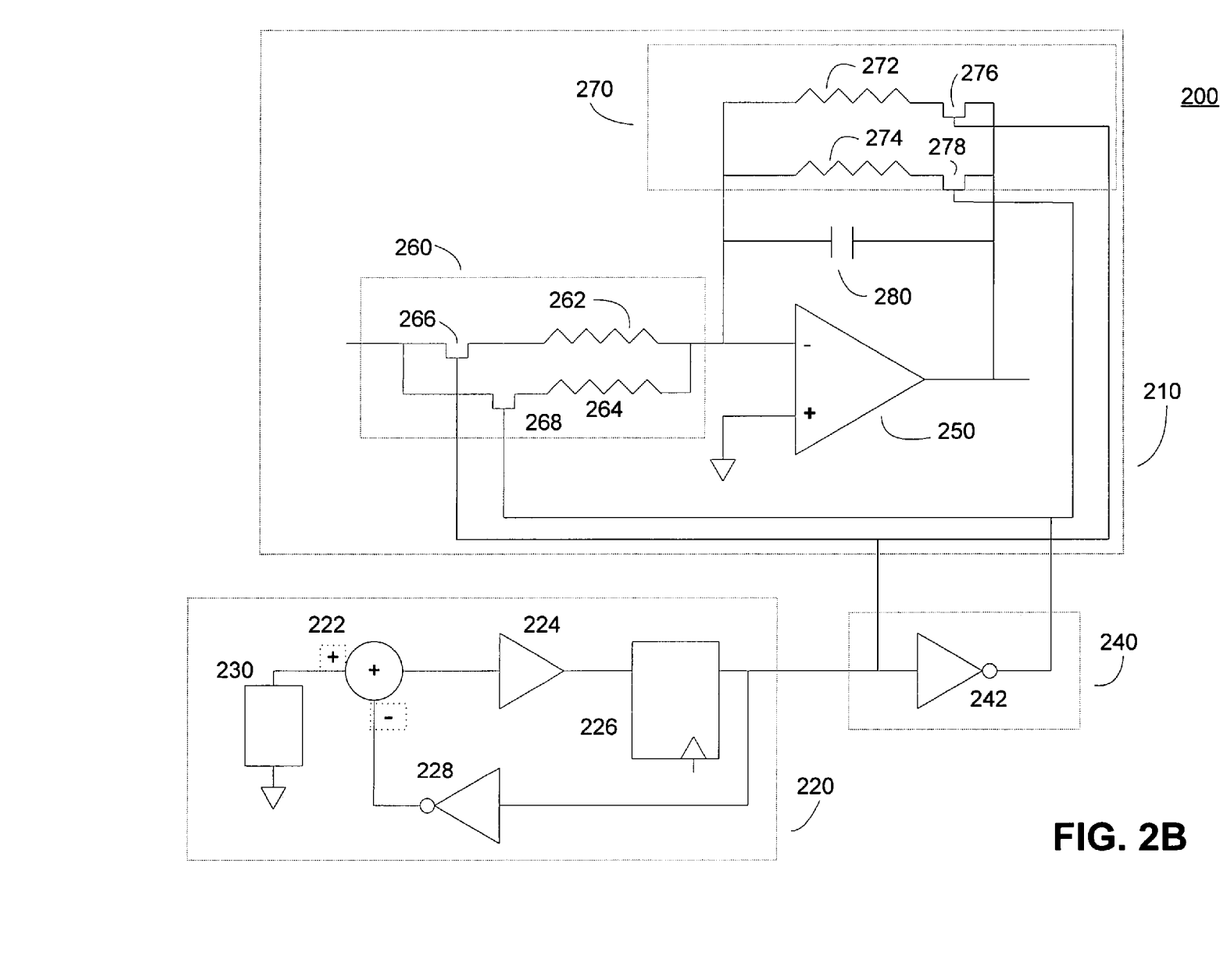

FIG. 2B is a detailed functional block diagram of an embodiment of a reconfigurable filter 200. As will be described in further detail, the reconfigurable filter 200 embodiment of FIG. 2B is implemented in the manner described above for the reconfigurable filter of FIG. 2A.

The reconfigurable filter 200 includes a filter module 210 having two control inputs that are clocked using a signal generated by the switch control module 220. A switch interface logic module 240 couples the output of the switch control module 220 to the control inputs of the filter module 210.

The filter module 210 in the embodiment of FIG. 2A is configured as an analog active lowpass filter. However, the filter module 210 is not limited to any particular configuration and may be configured as a lowpass, highpass, bandpass, band reject, all pass, and the like, or some other filter configuration. Additionally, the filter need not be an active filter, but may be a passive filter. Although a baseband filter is described, the filter module 210 is not limited to a baseband filter, but can be, for example, an Intermediate frequency (IF) filter, a Radio Frequency (RF) filter, and the like, or some other frequency filter. Moreover, the filter need not be an analog filter, but may be a digital filter. Although the filter module 210 of FIG. 2B is a first order filter, the filter module is not limited to any particular filter order, and can be implemented as a filter having any desired filter order.

The filter module 210 includes an op amp 250 having inverting and non-inverting inputs, and an output. A number of circuit elements are configured in conjunction with the op amp 250 to produce a lowpass filter response. An input circuit element, or input resistor 260 couples an input signal to the inverting input of the amplifier. A feedback circuit element or feedback resistor 270 couples the output of the op amp 250 to the inverting input. A feedback capacitor 280 connected in parallel to the feedback resistor 270 also couples the output of the op amp 250 to the inverting input. The non-inverting input of the op amp 250 is coupled to a voltage common.

The input circuit element or input resistor 260 includes a number of sub-elements, alternatively referred to as components. The input resistor 260 is implemented as a plurality of like components switchably arranged in parallel. Here, the number of like components is two, but any number of components may be used.

The sub-elements or components of the input resistor 260 include a first input resistor 262 in series with a first input switch 266 coupling the filter input to the inverting input of the op amp 250. The input resistor 260 also includes a second input resistor 264 in series with a second input switch 268 coupling the filter input to the inverting input of the op amp 250. As can be seen, the first input resistor 262 in combination with the first input switch 266 is connected in parallel to the second input resistor 264 in combination with the second input switch 268. Thus, one or both of the input resistors can be connected to the filter circuit if the corresponding input switches 266 and 268 are switched in or conducting. The input switches 266 and 268 can be controlled with signals of opposite polarity such that one of the filter components is coupled to the filter circuit at any instant of time. The input switches 266 and 268 can thus effectively operate as a single pole double throw switch that selectively switches between one or the other of the filter components.

If the first and second input resistors 262 and 264 are chosen to be different values, the effective value of the input resistor 260 can be determined according to the percentage of time that each of the first and second input resistors 262 and 264 are switched into the filter circuit. Thus, the value of the input resistor 260 can be determined by the formula:

$$R = P1 \times R1_A + (1-P1) \times R1_B$$

In the formula P1 represents the fraction of time that the first input resistor ($R1_A$) 262 is switched into the filter circuit and (1−P1) represents the fraction of time that the second input resistor ($R1_B$) 264 is switched into the filter circuit. The formula assumes that the time the first input resistor 262 is switched into the circuit is substantially exclusive of the time the second input resistor 264 is switched into the filter circuit.

Thus, the two component values define the extremes over which the input resistor 260 may vary, given the switching scheme described above. For example, a fixed switch state with the first input resistor 262 switched into the filter circuit results in the input resistor 260 having the value of the first input resistor 262. Similarly, a fixed switch state with the second input resistor 264 switched into the filter circuit results in the input resistor 260 having the value of the second input resistor 264. The value of the input resistor 260 can thus be varied by varying a switching control signal to vary the fraction of time that each of the components is connected to the filter circuit.

The feedback circuit element 270 is configured similar to the input circuit element 260. The feedback circuit element 260 includes a first feedback resistor 272 in series with a first feedback switch 276 coupling the filter output to the inverting input of the op amp 250. The feedback resistor 270 also includes a second feedback resistor 274 in series with a second feedback switch 278 coupling the filter output to the inverting input of the op amp 250. Varying the fraction of time that each of the feedback resistors 272 and 274 is connected to the filter circuit varies the value of the feedback resistor 270.

Effectively, the first set of filter components configure a filter having a first filter response and the second set of filter components configure a filter having a second filter response. Typically, the first and second filter responses are different. The switch control signal can be used to selectively switch between the first and second sets of filter components to produce a filter having a filter response between the first and second filter responses.

Thus, the values of the input resistor 260 and the feedback resistor 270 may be varied by varying the switch control signal. The values may be varied to allow the single reconfigurable filer 200 provide an optimized frequency response for multiple operating modes and multiple communication standards. For example, the reconfigurable filter can be configured to provide at least a lowpass filter response having a passband of substantially 150 kHz, 500 kHz, 3.8 MHz, and 9 MHz.

The input resistor 260 and the feedback resistor 270 are shown as controlled by the same switch control signal. This configuration can result in the two elements 260 and 270 varying in the same proportion. However, such proportionate variation is not a requirement and may not be desired in other embodiments. For example, in a multiple pole filter, the values of individual filter elements may be varied according to independent switch control signals. In still other embodiments, one or more filter elements may share the same switch control signal while other filter elements may use one or more independent switch control signals.

In one embodiment, a plurality of independent switch control signals can be used to vary filter element values in a multi-pole filter to change a filter frequency response. In another embodiment, one or more switch control signals can be used to change a filter characteristic. For example, in addition to changing the frequency response of a filter, the switch control signals can vary the element values to change a Butterworth filter response to a Chebyshev filter response.

Although the filter elements 260 and 270 are shown as resistive elements, the filter elements are not limited to resistive elements. For example, a configurable filter element can be a capacitive element or can be an inductive element. Furthermore, the configurable filter element is not limited to a passive element, but can include active filter elements.

In one embodiment, the filter element can be configured to be a passive capacitive filter element having two capacitors switchably connected in parallel. In another embodiment, the filter element can be configured to be a passive inductive filter element having two inductors switchably connected in parallel. In still another embodiment, the filter element can be configured to be an active filter element having two transconductor components ($g_m$), alternatively referred to as transconductance elements, switchably connected in parallel. In still other embodiments, other filter components can be switchably connected in parallel.

Although the filter elements are shown as having two components connected in parallel, each filter element can have more than two components connected in parallel. Further, more complex components, having more than one component and more than one component type, may be used.

The switch control module 220 can be configured as a delta-sigma modulator in order to generate a pseudo random switch control signal. The switch control module 220 includes a difference amplifier 222 or summer having inverting and non-inverting inputs. The output of the difference amplifier 222 is coupled to the input of an integrator. The output of the integrator 224 is coupled to a latch 226 having a clock input used to clock an input value to the output of the switch control module 220. The clock signal may be generated by an oscillator or system clock (not shown) that has a frequency greater than the highest desired passband frequency of the reconfigurable filter 200. The output of the latch 226 is also coupled to an input of a one bit Digital to Analog Converter (DAC), which may be an inverter 228. The output of the inverter 228 is coupled to the inverting input of the difference amplifier 222.

The delta-sigma modulator is shown as a first order delta-sigma modulator. However, other embodiments may use delta-sigma modulators of other orders such as, for example, a second, third, fourth, or fifth order delta-sigma modulator.

The pseudo random output of the delta-sigma modulator can be determined in part based on the value at the non-inverting input of the difference amplifier 222. A variable voltage source 230 may be used as an input to the difference amplifier 222. Thus, the value of the variable voltage source 230 can be used to determine the pseudo random output of the delta sigma converter, and thereby the frequency response of the reconfigurable filter 200.

The variable voltage source can be, for example, a continuously variable voltage source having a control input, a discretely variable voltage source, a plurality of fixed voltage sources switchably coupled to an output, a plurality of control words coupled to a DAC, and the like, or some other manner of providing a variable voltage output.

The output of the switch control module 220 is coupled to the input of the switch interface logic module 240. Because the filter module 210 in this embodiment uses mutually exclusive switch pairs, the switch interface logic module 240 may be configured as logic that transforms a single switch control signal to two switch control signals of opposite polarity. The switch interface logic module 240 may thus be configured as an inverter 242 coupled in parallel to a non-inverting through path to create two switch control output signals that are of opposite polarity.

Figure 2C:
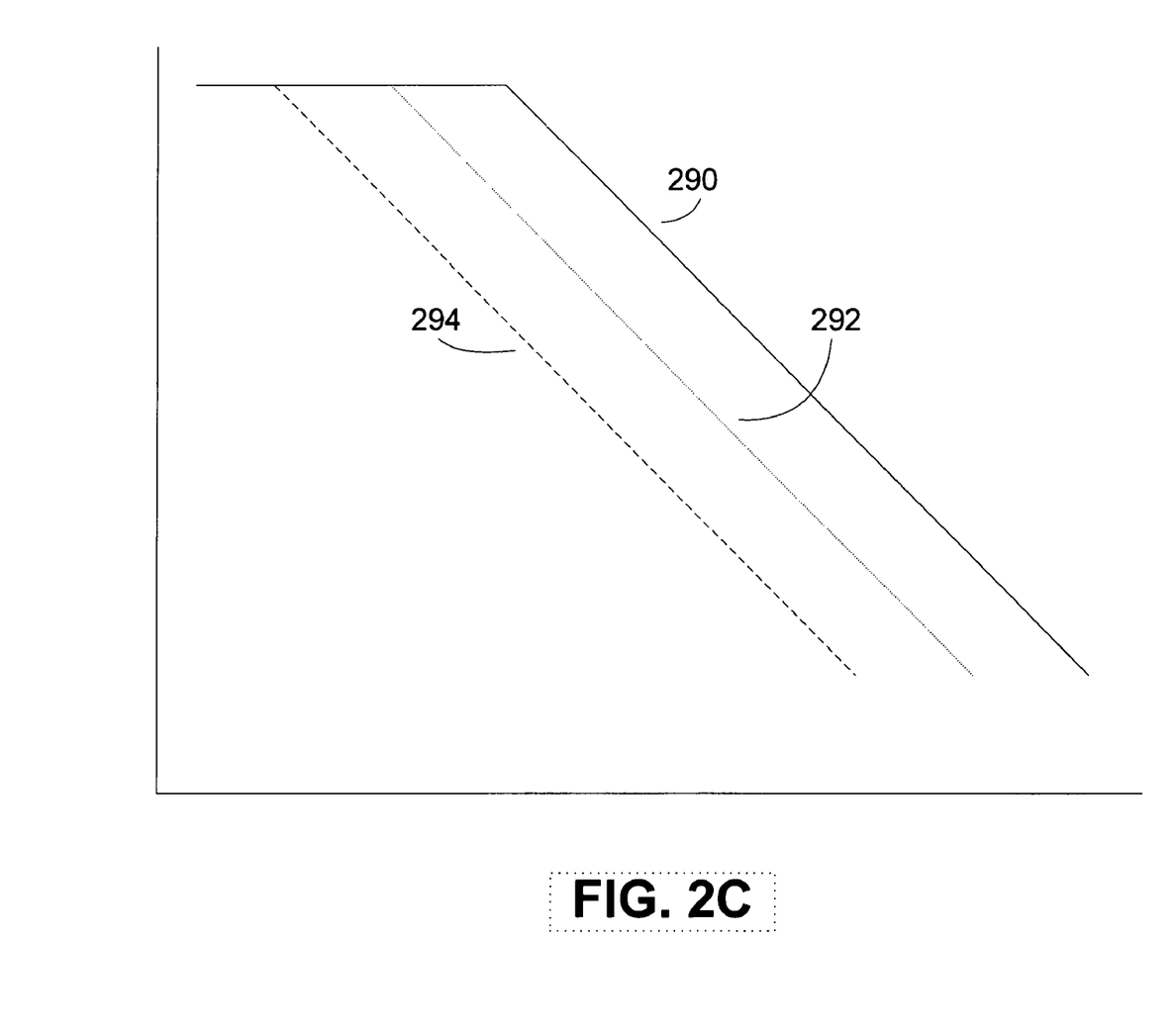
FIG. 2C is a plot of the frequency response of an embodiment of a reconfigurable filter.

FIG. 2C is a plot of the frequency response of a reconfigurable baseband filter, such as the reconfigurable filter of FIGS. 2A and 2B. A first frequency response 290 can represent the frequency response of the reconfigurable filter when a first set of filter elements is connected to the filter circuit. For example, in the reconfigurable filter of FIG. 2B, the frequency response may correspond to the condition where the first input resistor 262 and first feedback resistor 272 are connected to the filter circuit. That is, the first frequency response 290 may correspond to the switch control signal selecting a first filter configuration for substantially 100% of the time.

A second filter frequency response 294 may occur when a second set of filter elements is connected to the filter circuit. For example, in the reconfigurable filter of FIG. 2B, the second frequency response 294 may correspond to the condition where the second input resistor 264 and second feedback resistor 274 are connected to the filter circuit. The second frequency response 294 may thus correspond to the switch control signal selecting a second filter configuration for substantially 100% of the time.

Thus, by configuring the switch control signal to selectively switch between the first and second filter configurations, the filter can provide almost any frequency response between the first frequency response 290 and the second frequency response 294. For example, a third frequency response 292 mid-way between the first and second frequency responses, 290 and 294, can be produced by equally switching between the two sets of filter elements. The first set of filter elements call be switched in to the filter circuit for approximately 50% of the time and the second set of filter elements can be switched into the filter circuit for the remainder of the time. Thus, varying the fraction of time that each set of filter elements is switched into the filter circuit varies the frequency response.

Figure 3A:
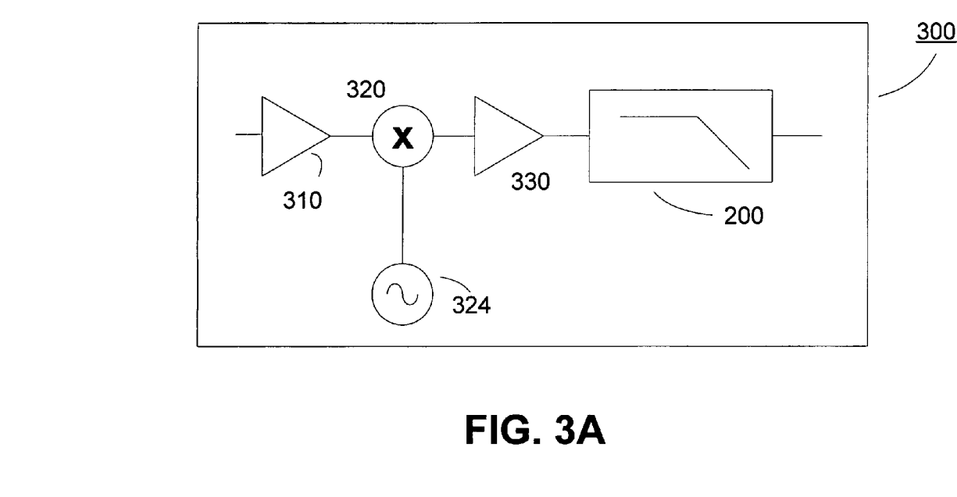
FIGS. 3A-3B are functional block diagrams of embodiments of communication device integrated circuits having a reconfigurable baseband filter.

FIG. 3A is a functional block diagram of embodiments of a receiver front end module 300, such as a multi-mode receiver front end that may be implemented in a receiver integrated circuit. The receiver front end module 300 can include an input that can be configured to receive signals from, for example, an antenna (not shown). The receiver front end module 300 may include an amplifier, such as a Low Noise Amplifier (LNA) configured to amplify the received signal. The amplifier may have sufficient frequency response to allow operation over multiple communication bands supporting communication standards. The output of the LNA 210 can be coupled to the input of a mixer 320 or some other type of frequency conversion stage. A Local Oscillator (LO) 324, which is typically implemented as a tunable LO, can be coupled to a LO port of the mixer 320. The frequency of the LO 324 can be tuned to frequency convert the received signal to an Intermediate Frequency (IF) or baseband. The output of the mixer 320 can be coupled to a buffer amplifier 330 that is typically used to amplify the frequency converted output and may also be used to provide a constant impedance load to the mixer 320. The output of the buffer amplifier 330 can be coupled to the input of a reconfigurable filter 200, such as the reconfigurable filter 200 of FIGS. 2A and 2B. The output of the reconfigurable filter 200 can be the output of the receiver IC 300 and can be configured to be coupled to a baseband processor (not shown).

Thus, a single receiver front end IC may be used for a receiver supporting multiple communication standards. The reconfigurable filter 200 allows the module 300 to have optimized filter response without requiring substantially greater die area to be allocated to the filter. Additionally, the reconfigurable filter using small die area can result in a lower module cost.

Figure 3B:
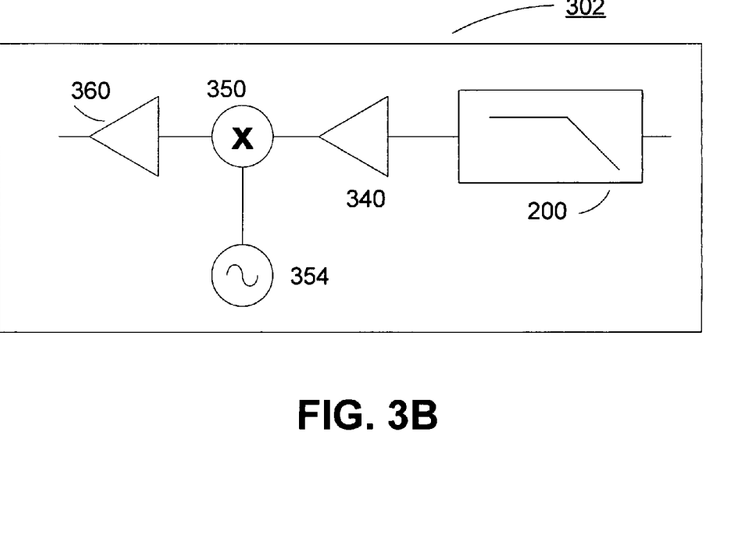

FIG. 3B shows a functional block diagram of a similar multi-mode transmitter module 302, which may be, for example, a transmitter IC. The multi-mode transmitter module 302 can include a reconfigurable filter 200, such as the reconfigurable filter shown in FIGS. 2A and 2B. The reconfigurable filter 200 can be configured to accept an input signal from, for example, a baseband module (not shown). The signal can be, for example, a baseband signal or an IF signal. The output of the reconfigurable filter 200 can be coupled to an input of a driver amplifier 340 that amplifies the filtered signal. The output of the driver amplifier can be coupled to the input of a mixer 330. A tunable LO can be used to drive the LO port of the mixer 350 to, for example, up convert the signal to an RF frequency. The output of the mixer 350 can be coupled to a power amplifier 360 that is configured to transmit the frequency converted signal via an antenna (not shown).

The multi-mode receiver 300 can be implemented on the same IC as the multi-mode transmitter 302 to provide a multi-mode transceiver IC. The multi-mode transceiver IC can be used to support multiple communication standards, such as wireless telephone standards or wireless LAN standards.

Figure 4:
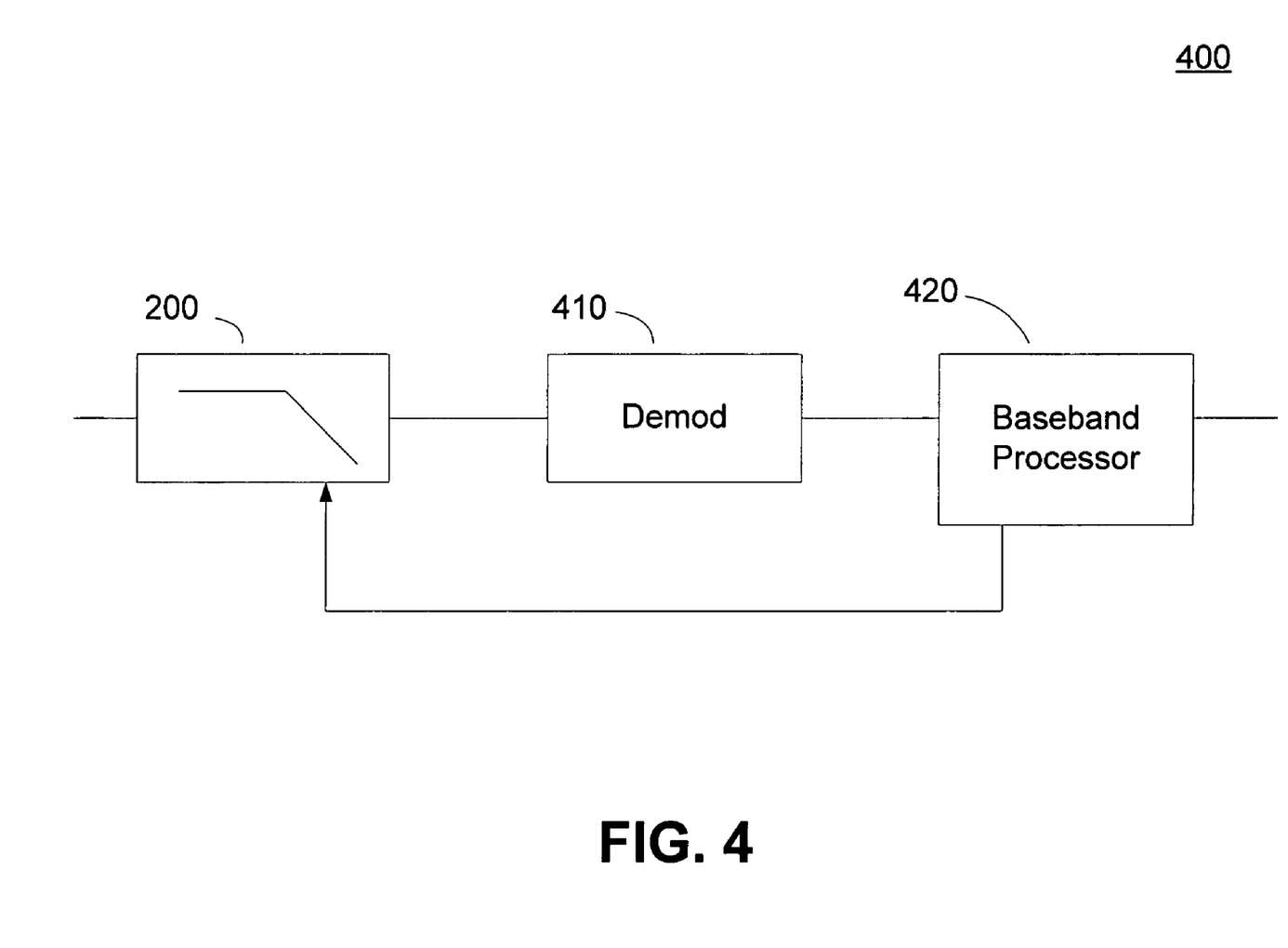
FIG. 4 is a functional block diagram of an embodiment of a baseband circuit having a reconfigurable baseband filter.

FIG. 4 is a functional block diagram of a baseband module 400 having a reconfigurable filter 200, such as the reconfigurable filter of FIGS. 2A and 2B. The baseband module 400 can be, for example, a baseband IC for use in a multi-mode communication device. The baseband module 400 can include a reconfigurable filter 200 configured to receive an input signal such as, for example, a signal from a receiver front end. The output of the reconfigurable filter 200 can be coupled to a demodulator 410 that is configured to demodulate the received signal according to one of a plurality of supported communication standards. The output of the demodulator 410 can be coupled to the input of a baseband processor 420 configured to further process the demodulated signal. The baseband processor 420 can, for example, generate a voice signal or display signal from the received information. The baseband processor 400 may also be configured to control the frequency response of the reconfigurable filter 200 by generating a mode select signal or some other bandwidth control signal. For example, the baseband processor may control the variable voltage source of a switch control module in the reconfigurable filter 200 to configure a particular frequency response associated with a particular communication standard.

Figure 5:
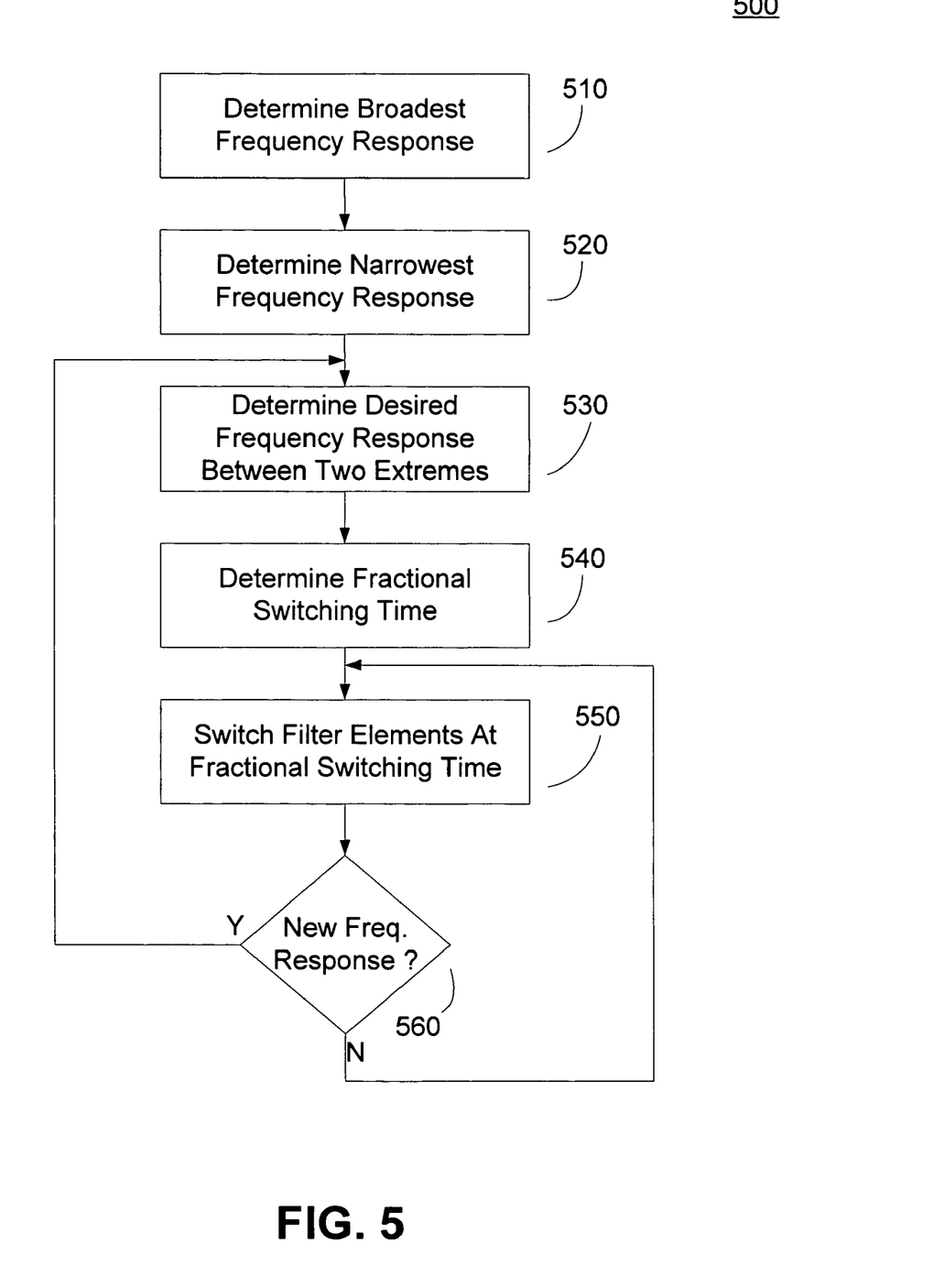
FIG. 5 is a flowchart of an embodiment of a method of configuring a frequency response in a reconfigurable filter.

FIG. 5 is a flowchart of a method 500 of configuring the frequency response of a reconfigurable filter. The reconfigurable filter can be, for example, the reconfigurable filter of FIGS. 2A and 2B. The method 500 can be performed, for example, within the RF or baseband ICs shown in FIGS. 3 and 4.

The method 500 begins at block 510 where the IC determines the broadest frequency response provided by the reconfigurable filter. In one embodiment, each IC or each lot of ICs can be characterized for maximum and minimum frequency responses and the value of the frequency responses stored in memory or storage device within the IC. An IC processor can then determine a maximum, or broadest, frequency response by reading the memory location holding the previously determined value.

The IC then proceeds to block 520 and determines the narrowest, or minimum, frequency response provided by the reconfigurable filter. The IC can determine the minimum bandwidth, for example, using the same method used to determine the broadest frequency response.

The IC then proceeds to block 530 and determines the desired frequency response. Typically, the desired frequency response is limited to occurring between the broadest and narrowest frequency responses. In one embodiment, the IC can be configured to operate in accordance with a predetermined number of communication standards. Each communication standard may have an associated bandwidth that can be provided by the reconfigurable filter. The IC may generate or receive a control signal that indicates the mode of operation, and thus a corresponding desired frequency response.

After determining the desired frequency response, the IC proceeds to block 540 and determines a fractional switching time. The fractional switching time can represent the fraction of time that a first set of filter elements is switched into the filter circuit. The remainder of time can represent the time that a second set of filter elements is switched into the filter circuit. The fractional switching time can be represented by a digital value, voltage, or current. In the reconfigurable filter of FIG. 2B, the fractional switching time can be represented by the voltage output of the variable voltage source coupled to the delta-sigma modulator.

The IC then proceeds to block 550 and switches the filter elements at a rate determined by the fractional switching time. The IC can switch the filter elements using a periodic or a pseudo random switching pattern. In the reconfigurable filter embodiment of FIG. 2B, a delta-sigma modulator provides a pseudo random switch control signal that switches the filter elements at the fractional allocation used to provide the desired frequency response.

The IC then proceeds to decision block 560 to determine if a new frequency response is desired. A change in the frequency response may be desired, for example, if the IC changes to a different communication mode.

If a new frequency response is desired, the IC returns to block 530 to determine the new desired frequency response. However, if no change in the frequency response is desired, the IC returns to block 550 and continues to switch the filter elements at the determined fractional allocation.

Thus, by determining a fractional allocation between two frequency response extremes, the IC can provide a filter having almost any desired frequency response between a maximum and minimum frequency response. The ability to configure multiple frequency responses using filter elements that comprise a pair of like sub-elements allows a filter to be produced in a relatively small die area and at a lower cost relative to having multiple filters connected in parallel.

Thus, a reconfigurable filter and a method of reconfiguring a frequency response of a filter have been disclosed. The reconfigurable filter can include one or more elements arranged in a filter configuration. One or more of the filter elements can be a configurable filter element. Each configurable element can include a plurality of like filter elements switchably connectable to the filter circuit. In one embodiment, each configurable filter element includes a pair of like filter components switchably connected in parallel. The value of the configurable element can be modified by switching between the pair of filter components.

A switch control module generating a switch control signal can generate a periodic switch control signal or can generate a pseudo random switch control signal. The switch control signal can be configured to switch between the filter components at a rate that is higher than the desired filter passband.

The switch control module can generate a pseudo random switch control signal using, for example, a delta-sigma modulator. Alternatively, the switch control module can generate a periodic switch control signal having a duty cycle that varies in order to vary the frequency response of the filter. In still another embodiment, the switch control module can generate a pseudo random switch control signal that has a duty cycle that varies in order to vary the frequency response of the filter.

The above description of the disclosed embodiments is provided to enable any person skilled in the art to make or use the disclosure. Various modifications to these embodiments will be readily apparent to those skilled in the art, and the generic principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A reconfigurable filter comprising:
    at least one configurable element having a value based in part on a fractional period in which a control signal is at a first signal level;
    a delta sigma modulator configured to generate a pseudo random output as the control signal, the delta sigma modulator including a variable voltage source, and an output of the variable voltage source controlling a distribution of first and second signal levels output by the delta sigma modulator; and
    a filter element coupled to the at least one configurable element to produce a filter circuit.

* * * * *